United States Patent
Xu

(10) Patent No.: US 11,201,177 B2
(45) Date of Patent: Dec. 14, 2021

(54) ARRAY SUBSTRATE, MANUFACTURING METHOD OF ARRAY SUBSTRATE, AND DISPLAY PANEL

(71) Applicant: TCL China Star Optoelectronics Technology Co., Ltd., Shenzhen (CN)

(72) Inventor: Peipei Xu, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 173 days.

(21) Appl. No.: 16/627,291

(22) PCT Filed: Dec. 12, 2019

(86) PCT No.: PCT/CN2019/124812
§ 371 (c)(1),
(2) Date: Dec. 29, 2019

(87) PCT Pub. No.: WO2021/109193
PCT Pub. Date: Jun. 10, 2021

(65) Prior Publication Data
US 2021/0327921 A1    Oct. 21, 2021

(30) Foreign Application Priority Data
Dec. 2, 2019 (CN) .......................... 201911213977.0

(51) Int. Cl.
*H01L 27/12* (2006.01)
*G02F 1/1362* (2006.01)
*G02F 1/1343* (2006.01)

(52) U.S. Cl.
CPC ...... *H01L 27/1244* (2013.01); *H01L 27/1259* (2013.01); *G02F 1/13439* (2013.01); *G02F 1/136227* (2013.01)

(58) Field of Classification Search
None
See application file for complete search history.

(56) References Cited

U.S. PATENT DOCUMENTS

| 5,883,682 A * | 3/1999 | Kim ................... G02F 1/136227 349/43 |
| 2018/0083142 A1 * | 3/2018 | Chi ...................... H01L 27/1222 |

* cited by examiner

*Primary Examiner* — Steven M Christopher

(57) ABSTRACT

An array substrate of the present invention includes: a first metal layer; an insulating layer on the first metal layer; an amorphous silicon layer on a surface of the insulating layer away from the first metal layer; an amorphous silicon doped layer arranged on a surface of the amorphous silicon layer away from the insulating layer; a second metal layer including a first portion and a second portion, the first portion arranged on a surface of the amorphous silicon doped layer away from the amorphous silicon layer, a second portion arranged on the first surface and in contact with the first metal layer; a protective layer arranged on the first metal layer and the second metal layer; a first transparent electrode connected to the first metal layer through the protective layer; and a second transparent electrode connected to the second metal layer through the protective layer.

20 Claims, 2 Drawing Sheets

US 11,201,177 B2

ARRAY SUBSTRATE, MANUFACTURING METHOD OF ARRAY SUBSTRATE, AND DISPLAY PANEL

RELATED APPLICATIONS

This application is a National Phase of PCT Patent Application No. PCT/CN2019/124812 having International filing date of Dec. 12, 2019, which claims the benefit of priority of Chinese Patent Application No. 201911213977.0 filed on Dec. 2, 2019. The contents of the above applications are all incorporated by reference as if fully set forth herein in their entirety.

FIELD AND BACKGROUND OF THE INVENTION

The present application relates to a field of display panel manufacturing techniques and in particular, to an array substrate, a manufacturing method of an array substrate, and a display panel.

Liquid crystal displays (LCDs) are widely used flat panel displays. In peripheral wiring of LCD panels, it is often necessary to transmit electrical signals from a transparent electrode layer to a second metal layer or a first metal layer. A common method is to use a transparent electrode in a via hole. However, there are an insulating layer, an amorphous silicon layer, a second metal layer, and a protective layer between the first metal layer and the transparent electrode layer, so the via hole is particularly deep, which easily leads to breakage of the transparent electrode layer at a slope of the second metal layer.

Therefore, there is a need to provide a new array substrate which can prevent the transparent electrode layer from being broken, and reduces contact resistance in shallow and deep holes.

SUMMARY OF THE INVENTION

The present invention provides an array substrate, a manufacturing method of the array substrate, and a display panel. The present invention solves a problem that a transparent electrode layer is easily broken in conventional techniques.

The present invention provides an array substrate, comprising:

a first metal layer comprising a first surface and a second surface disposed opposite to each other;

an insulating layer disposed on the first surface;

an amorphous silicon layer disposed on a surface of the insulating layer away from the first metal layer;

an amorphous silicon doped layer disposed on a surface of the amorphous silicon layer away from the insulating layer;

a second metal layer comprising a first portion and a second portion, wherein the first portion is disposed on a surface of the amorphous silicon doped layer away from the amorphous silicon layer, and the second portion is disposed on the first surface and in contact with the first metal layer;

a protective layer disposed on the first metal layer and the second metal layer, wherein a first via hole is defined at a position where the protective layer is in contact with the first metal layer, and a second via hole is defined at a position where the protective layer is in contact with the first portion;

a first transparent electrode connected to the first metal layer through the first via hole; and a second transparent electrode connected to the second metal layer through the second via hole.

In some embodiments of the present invention, the first metal layer is made of copper, and the second metal layer is made of aluminum.

In some embodiments of the present invention, the first transparent electrode and the second transparent electrode are disposed at two sides of the second portion.

In some embodiments of the present invention, the first transparent electrode comprises a first section and a second section, the first section is connected to the second section, the first section is disposed on a surface of the protective layer, and the second section is extended into the first via hole and in contact with the first metal layer.

In some embodiments of the present invention, the second transparent electrode comprises a third section and a fourth section, the third section is disposed on a surface of the protective layer, and the fourth section is extended into the second via hole and in contact with the first portion.

In some embodiments of the present invention, the array substrate further comprises a glass substrate, and the glass substrate is disposed on the second surface of the first metal layer.

In some embodiments of the present invention, the first transparent electrode comprises a first section and a second section, the first section is disposed on a surface of the protective layer, and the second section is extended into the first via hole and in contact with the first metal layer, the second transparent electrode comprises a third section and a fourth section, the third section is disposed on a surface of the protective layer, and the fourth section is extended into the second via hole and in contact with the first portion.

The present invention further provides a manufacturing method of an array substrate, comprising following steps:

providing a first metal layer;

forming an insulating layer on the first metal layer;

forming an amorphous silicon layer on the insulating layer;

forming an amorphous silicon doped layer on the amorphous silicon layer;

patterning by etching the insulating layer, the amorphous silicon layer, and the amorphous silicon doped layer, wherein a second metal layer is formed on a surface of the amorphous silicon doped layer away from the amorphous silicon layer and on the first metal layer;

forming a protective layer on the first metal layer and the second metal layer, wherein a first via hole is arranged at a position where the protective layer is in contact with the first metal layer, and a second via hole is arranged at a position where the protective layer is in contact with the first portion;

connecting a first transparent electrode to the first metal layer through the first via hole; and connecting a second transparent electrode to the second metal layer through the second via hole.

In some embodiments of the present invention, the first metal layer is made of copper, and the second metal layer is made of aluminum.

In some embodiments of the present invention, the first transparent electrode and the second transparent electrode are disposed at both sides of the second portion.

In some embodiments of the present invention, the first transparent electrode comprises a first section and a second section, the first section is connected to the second section, the first section is formed on a surface of the protective layer, and the second section is extended into the first via hole and in contact with the first metal layer.

In some embodiments of the present invention, the second transparent electrode comprises a third section and a fourth section, the third section is formed on a surface of the protective layer, and the fourth section is extended into the second via hole and in contact with the first portion.

In some embodiments of the present invention, the array substrate further comprises a glass substrate, and the glass substrate is attached to the second surface of the first metal layer.

In some embodiments of the present invention, the first transparent electrode comprises a first section and a second section, the first section is arranged on a surface of the protective layer, and the second section is extended into the first via hole and in contact with the first metal layer, the second transparent electrode comprises a third section and a fourth section, the third section is formed on a surface of the protective layer, and the fourth section is extended into the second via hole and in contact with the first portion.

The present invention further provides a display panel comprising an array substrate, the array substrate comprising:

a first metal layer comprising a first surface and a second surface disposed opposite to each other;

an insulating layer disposed on the first surface;

an amorphous silicon layer disposed on a surface of the insulating layer away from the first metal layer;

an amorphous silicon doped layer disposed on a surface of the amorphous silicon layer away from the insulating layer;

a second metal layer comprising a first portion and a second portion, wherein the first portion is disposed on a surface of the amorphous silicon doped layer away from the amorphous silicon layer, and the second portion is disposed on the first surface and in contact with the first metal layer;

a protective layer disposed on the first metal layer and the second metal layer, wherein a first via hole is defined at a position where the protective layer is in contact with the first metal layer, and a second via hole is defined at a position where the protective layer is in contact with the first portion;

a first transparent electrode connected to the first metal layer through the first via hole; and a second transparent electrode connected to the second metal layer through the second via hole.

In some embodiments of the present invention, the first metal layer is made of copper, and the second metal layer is made of aluminum.

In some embodiments of the present invention, the first transparent electrode and the second transparent electrode are disposed at two sides of the second portion.

In some embodiments of the present invention, the first transparent electrode comprises a first section and a second section, the first section is disposed on a surface of the protective layer, and the second section is extended into the first via hole and in contact with the first metal layer.

In some embodiments of the present invention, the second transparent electrode comprises a third section and a fourth section, the third section is disposed on a surface of the protective layer, and the fourth section is extended into the second via hole and in contact with the first portion.

In some embodiments of the present invention, the array substrate further comprises a glass substrate, and the glass substrate is disposed on the second surface of the first metal layer.

Advantages of the Present Invention

The present invention provides an array substrate, comprising:

a first metal layer comprising a first surface and a second surface disposed opposite to each other;

an insulating layer disposed on the first surface;

an amorphous silicon layer disposed on a surface of the insulating layer away from the first metal layer;

an amorphous silicon doped layer disposed on a surface of the amorphous silicon layer away from the insulating layer;

a second metal layer comprising a first portion and a second portion, wherein the first portion is disposed on a surface of the amorphous silicon doped layer away from the amorphous silicon layer, and the second portion is disposed on the first surface and in contact with the first metal layer;

a protective layer disposed on the first metal layer and a second metal layer, wherein a first via hole is defined at a position where the protective layer is in contact with the first metal layer, and a second via hole is defined at a position where the protective layer is in contact with the first portion;

a first transparent electrode connected to the first metal layer through the first via hole; and a second transparent electrode connected to the second metal layer through the second via hole.

In the structure of the present invention, the first metal layer directly contacts the second metal layer, thereby the first metal layer and the second metal layer are electrically connected to each other. In addition, the first transparent electrode and the second transparent electrode are extended through the relatively shallow first and second via holes, so that the first transparent electrode and the first metal layer are electrically connected to each other, and the second transparent electrode and the second metal layer are electrically connected to each other. The first via hole and the second via hole are only extended through the protective layer, so the via holes are shallow. Therefore, the first transparent electrode and the second transparent electrode are not easily broken when they extend into the via holes.

BRIEF DESCRIPTION OF THE SEVERAL VIEWS OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work.

DESCRIPTION OF SPECIFIC EMBODIMENTS OF THE INVENTION

The present invention will be clearly and completely described below in conjunction with embodiments with reference to the accompanying drawings. Obviously, the described embodiments are only a part of the embodiments of the present invention, but not all the embodiments. Based on the embodiments in the present invention, all other embodiments obtained by those skilled in the art without inventiveness fall into the protection scope of the present invention.

The present invention provides an array substrate, a manufacturing method of an array substrate, and a display panel. A detailed description of the array substrate is provided below.

Figure 1:
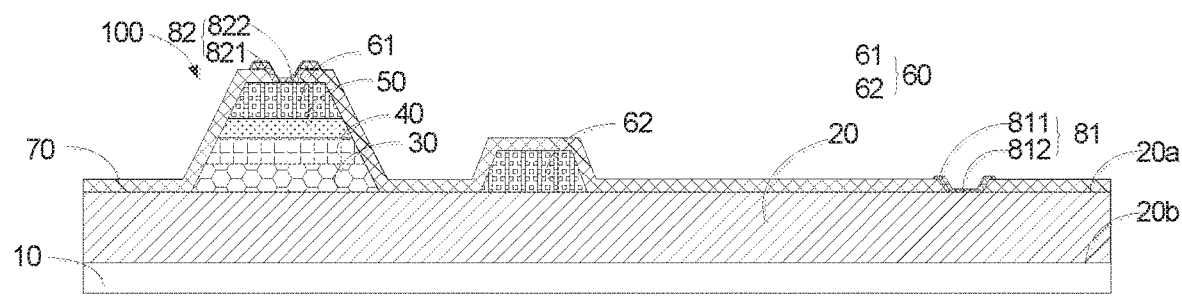
FIG. 1 is a schematic structural view illustrating an array substrate according to one embodiment of the present invention.
Figure 2:
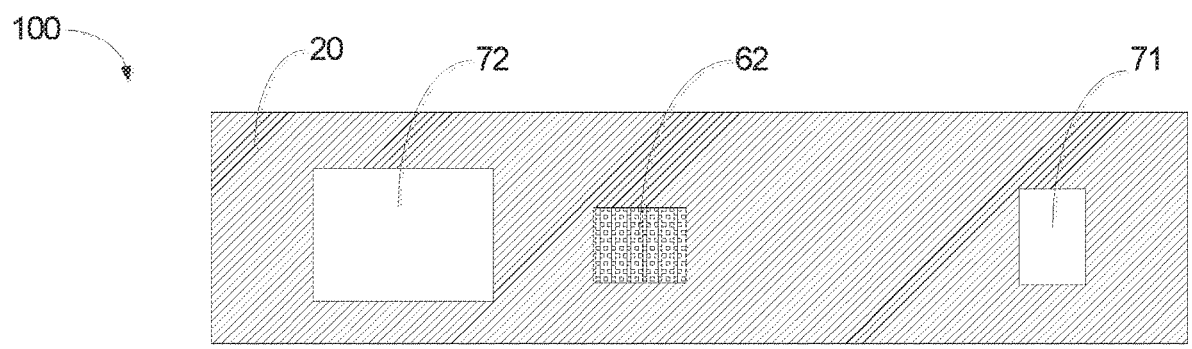
FIG. 2 is another schematic structural view illustrating the array substrate according to one embodiment of the present invention.

Please refer to FIGS. 1 and 2. FIG. 1 is a schematic structural view illustrating an array substrate 100 according to one embodiment of the present invention. FIG. 2 is another schematic structural view illustrating the array substrate 100 according to one embodiment of the present invention. The present invention provides the array substrate 100. The array substrate 100 comprises a first metal layer 20, an insulating layer 30, an amorphous silicon layer 40, an amorphous silicon doped layer 50, a second metal layer 60, a protective layer 70, a first transparent electrode 81, and a second transparent electrode 82. The first metal layer 20 comprises a first surface 20a and a second surface 20b disposed opposite to each other. The insulating layer 30 is disposed on the first surface 20a. The amorphous silicon layer 40 is disposed on a surface of the insulating layer 30 away from the first metal layer 20. The amorphous silicon doped layer 50 is disposed on a surface of the amorphous silicon layer 40 away from the insulating layer 30. The second metal layer 60 comprises a first portion 61 and a second portion 62. The first portion 61 is disposed on a surface of the amorphous silicon doped layer 50 away from the amorphous silicon layer 40, and the second portion 62 is disposed on the first surface 20a and in contact with the first metal layer 20. The protective layer 70 is disposed on the first metal layer 20 and the second metal layer 60, wherein a first via hole 71 is defined at a position where the protective layer 70 is in contact with the first metal layer 20, and a second via hole 72 is defined at a position where the protective layer 70 is in contact with the first portion 61. The first transparent electrode 81 is connected to the first metal layer 20 through the first via hole 71. The second transparent electrode 82 is connected to the second metal layer 60 through the second via hole 72.

In the present disclosure, it should be understood that the terms, such as "up", "down", "front", "rear", "left", "right", "vertical", "horizontal", "top", "bottom", and "inner", and "outer", indicate orientations or positional relationships based on the drawings, and are only for ease of the description. These directional terms are not intended to indicate or imply the device or element referred to must have a specific orientation or be constructed and operated in a specific orientation, and therefore cannot be understood as limitations on this application. In addition, the terms "first" and "second" are used for illustrative purposes only and cannot be understood as indicating or implying relative importance or implicitly indicating the number of technical features indicated. Therefore, the features defined with "first" and "second" can explicitly or implicitly include one or more of the features. In the present application, "a plurality" is two or more, unless it is specifically defined otherwise.

The array substrate 100 further comprises a glass substrate 10. The glass substrate 10 is disposed on the second surface 20b of the first metal layer 20.

The first transparent electrode 81 comprises a first section 811 and a second section 812. The first section 811 is connected to the second section 812. The first section 811 is disposed on a surface of the protective layer 70, and the second section 812 is extended into the first via hole 71 and in contact with the first metal layer 20, the second transparent electrode 82 comprises a third section 821 and a fourth section 822, the third section 821 is disposed on a surface of the protective layer 70, and the fourth section 822 is extended into the second via hole 72 and in contact with the first portion 61.

In the array substrate of the present invention, a first metal layer 20 comprises a first surface 20a and a second surface 20b disposed opposite to each other. An insulating layer 30 is disposed on the first surface 20a. An amorphous silicon layer 40 is disposed on a surface of the insulating layer 30 away from the first metal layer 20. The amorphous silicon doped layer 50 is disposed on a surface of the amorphous silicon layer 40 away from the insulating layer 30. A second metal layer 60 is disposed on a surface of the amorphous silicon doped layer 50 away from the amorphous silicon layer 40. A protective layer 70 is disposed on the first metal layer 20 and the second metal layer 60. A first via hole 71 is defined at a position where the protective layer 70 is in contact with the first metal layer 20, and a second via hole 72 is defined at a position where the protective layer 70 is in contact with the second metal layer 60. A first transparent electrode 81 is connected to the first metal layer 20 through the first via hole 71. A second transparent electrode 82 is connected to the second metal layer 60 through the second via hole 72. In the structure of the present invention, the first metal layer 20 is in direct contact with the second metal layer 60, so that the first metal layer 20 and the second metal layer 60 can be electrically connected to each other. In addition, the first transparent electrode 81 and the second transparent electrode 82 are extended through the shallower first via hole 71 and the shallower second via hole 72, respectively, so that electrical connection is established between the first transparent electrode 81 and the first metal layer 20 and between the second transparent electrode 82 and the second metal layer 60. Moreover, since the first via hole 71 and the second via hole 72 only extend through the protective layer 70, so the via holes are shallow. Therefore, the first transparent electrode 81 and the second transparent electrode 82 are not easily broken when they extend into the via holes.

Figure 3:
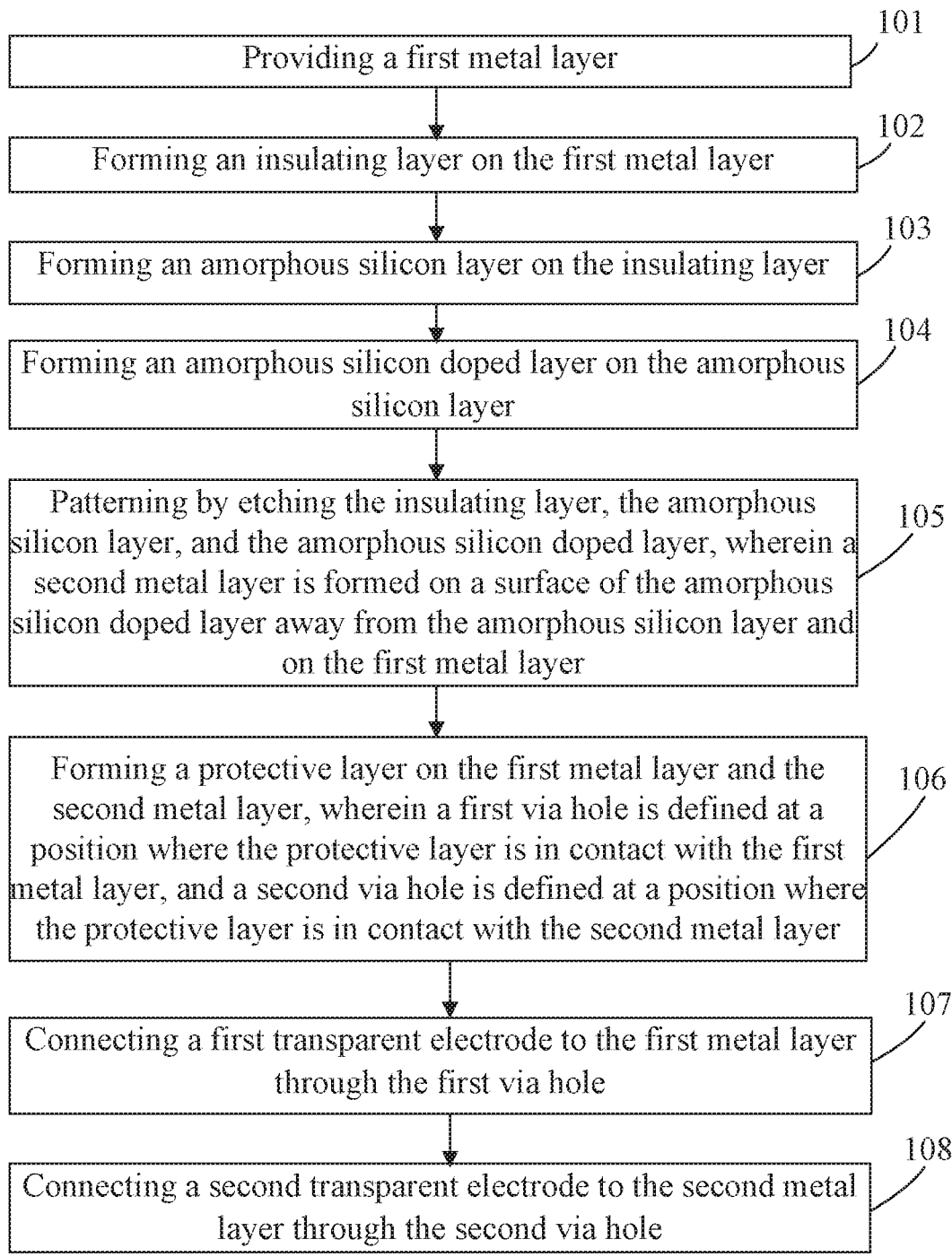
FIG. 3 is a process flow diagram illustrating a manufacturing method of the array substrate according to one embodiment of the present invention.

Please refer to FIG. 3. FIG. 3 is a process flow diagram illustrating a manufacturing method of an array substrate according to one embodiment of the present invention.

The present invention provides a manufacturing method of an array substrate, comprising:

101: providing a first metal layer;

102: forming an insulating layer on the first metal layer;

103: forming an amorphous silicon layer on the insulating layer;

104: forming an amorphous silicon doped layer on the amorphous silicon layer;

105: patterning by etching the insulating layer, the amorphous silicon layer, and the amorphous silicon doped layer, wherein a second metal layer is formed on a surface of the amorphous silicon doped layer away from the amorphous silicon layer and on the first metal layer;

106: forming a protective layer on the first metal layer and the second metal layer, wherein a first via hole is defined at a position where the protective layer is in contact with the first metal layer, and a second via hole is defined at a position where the protective layer is in contact with the second metal layer;

107: connecting a first transparent electrode to the first metal layer through the first via hole; and 108: connecting a second transparent electrode to the second metal layer through the second via hole.

The first metal layer and the second metal layer are two different metal materials. Specifically, material of the first metal layer is copper, and material of the second metal layer is aluminum. During the etching of the second metal layer, although both the first metal layer and the second metal layer can be in contact with an etchant, the acid of the etchant cannot etch the first metal layer because the materials of the first metal layer and the second metal layer are different. Therefore, a pattern of the second metal layer is formed, and the etchant does not affect the first metal layer.

The array substrate further comprises a glass substrate, and the glass substrate is disposed on the second surface of the first metal layer.

The first transparent electrode comprises a first section and a second section, the first section is connected to the second section, the first section is disposed on a surface of the protective layer, and the second section is extended into the first via hole and in contact with the first metal layer. The second transparent electrode comprises a third section and a fourth section, the third section is disposed on a surface of the protective layer, and the fourth section is extended into the second via hole and in contact with the first portion.

In the present invention, the first metal layer and the second metal layer are in direct contact with each other, so the first metal layer and the second metal layer are electrically connected to each other. In addition, the first transparent electrode and the second transparent electrode are extended through the shallow first via hole and the shallow second via hole, so electrical connection is established between the first transparent electrode and the first metal layer and between the second transparent electrode and the second metal layer. The first via hole and the second via hole are only extended through the protective layer, and thus the first and second via holes are shallow. Therefore, the first transparent electrode and the second transparent electrode do not easily break when they extend into the via hole.

The present invention further provides a display panel. The display panel includes the array substrate described above. Since the array substrate has been described in detail in the above embodiments, a detailed description of the array substrate is not repeated for brevity.

The array substrate, the manufacturing method of the array substrate, and the display panel of the present invention have been described in detail above. Specific examples are used to explain the principles and embodiments of the present invention. The description of the above embodiments is only for ease of understanding of the present invention. Modifications and changes can be made by persons of ordinary skill in the art based on the ideas of the present application. Accordingly, the content of the present disclosure should not be construed as a limitation on the present application.

What is claimed is:

1. An array substrate, comprising:
a first metal layer comprising a first surface and a second surface disposed opposite to each other;
an insulating layer disposed on the first surface;
an amorphous silicon layer disposed on a surface of the insulating layer away from the first metal layer;
an amorphous silicon doped layer disposed on a surface of the amorphous silicon layer away from the insulating layer;
a second metal layer comprising a first portion and a second portion, wherein the first portion is disposed on a surface of the amorphous silicon doped layer away from the amorphous silicon layer, and the second portion is disposed on the first surface and in contact with the first metal layer;
a protective layer disposed on the first metal layer and the second metal layer, wherein a first via hole is defined at a position where the protective layer is in contact with the first metal layer, and a second via hole is defined at a position where the protective layer is in contact with the first portion;
a first transparent electrode connected to the first metal layer through the first via hole; and
a second transparent electrode connected to the second metal layer through the second via hole.

2. The array substrate according to claim 1, wherein the first metal layer is made of copper, and the second metal layer is made of aluminum.

3. The array substrate according to claim 1, wherein the first transparent electrode and the second transparent electrode are disposed at two sides of the second portion.

4. The array substrate according to claim 1, wherein the first transparent electrode comprises a first section and a second section, the first section is connected to the second section, the first section is disposed on a surface of the protective layer, and the second section is extended into the first via hole and in contact with the first metal layer.

5. The array substrate according to claim 1, wherein the second transparent electrode comprises a third section and a fourth section, the third section is disposed on a surface of the protective layer, and the fourth section is extended into the second via hole and in contact with the first portion.

6. The array substrate according to claim 1, wherein the array substrate further comprises a glass substrate, and the glass substrate is disposed on the second surface of the first metal layer.

7. The array substrate according to claim 1, wherein the first transparent electrode comprises a first section and a second section, the first section is disposed on a surface of the protective layer, and the second section is extended into the first via hole and in contact with the first metal layer, the second transparent electrode comprises a third section and a fourth section, the third section is disposed on a surface of the protective layer, and the fourth section is extended into the second via hole and in contact with the first portion.

8. A manufacturing method of an array substrate, comprising following steps:
providing a first metal layer, wherein the first metal layer comprises a first surface and a second surface arranged opposite to each other;
forming an insulating layer on the first metal layer;
forming an amorphous silicon layer on the insulating layer;
forming an amorphous silicon doped layer on the amorphous silicon layer;
patterning by etching the insulating layer, the amorphous silicon layer, and the amorphous silicon doped layer, wherein a second metal layer is formed on a surface of the amorphous silicon doped layer away from the amorphous silicon layer and on the first metal layer, the second metal layer comprises a first portion and a second portion, the first portion is arranged on the surface of the amorphous silicon doped layer away from the amorphous silicon layer, and the second portion is arranged on a first surface and contacts the first metal layer;
forming a protective layer on the first metal layer and the second metal layer, wherein a first via hole is arranged at a position where the protective layer is in contact with the first metal layer, and a second via hole is arranged at a position where the protective layer is in contact with the second metal layer;
connecting a first transparent electrode to the first metal layer through the first via hole; and connecting a second transparent electrode to the second metal layer through the second via hole.

9. The manufacturing method of the array substrate according to claim 8, wherein the first metal layer is made of copper, and the second metal layer is made of aluminum.

10. The manufacturing method of the array substrate according to claim 8, wherein the first transparent electrode and the second transparent electrode are disposed at both sides of the second portion.

11. The manufacturing method of the array substrate according to claim 8, wherein the first transparent electrode comprises a first section and a second section, the first section is connected to the second section, the first section is formed on a surface of the protective layer, and the second section is extended into the first via hole and in contact with the first metal layer.

12. The manufacturing method of the array substrate according to claim 8, wherein the second transparent electrode comprises a third section and a fourth section, the third section is formed on a surface of the protective layer, and the fourth section is extended into the second via hole and in contact with the first portion.

13. The manufacturing method of the array substrate according to claim 8, wherein the array substrate further comprises a glass substrate, and the glass substrate is attached to the second surface of the first metal layer.

14. The manufacturing method of the array substrate according to claim 13, wherein the first transparent electrode comprises a first section and a second section, the first section is arranged on a surface of the protective layer, and the second section is extended into the first via hole and in contact with the first metal layer, the second transparent electrode comprises a third section and a fourth section, the third section is formed on a surface of the protective layer, and the fourth section is extended into the second via hole and in contact with the first portion.

15. A display panel comprising an array substrate, the array substrate comprising:
a first metal layer comprising a first surface and a second surface disposed opposite to each other;
an insulating layer disposed on the first surface;
an amorphous silicon layer disposed on a surface of the insulating layer away from the first metal layer;
an amorphous silicon doped layer disposed on a surface of the amorphous silicon layer away from the insulating layer;
a second metal layer comprising a first portion and a second portion, wherein the first portion is disposed on a surface of the amorphous silicon doped layer away from the amorphous silicon layer, and the second portion is disposed on the first surface and in contact with the first metal layer;
a protective layer disposed on the first metal layer and the second metal layer, wherein a first via hole is defined at a position where the protective layer is in contact with the first metal layer, and a second via hole is defined at a position where the protective layer is in contact with the first portion;
a first transparent electrode connected to the first metal layer through the first via hole; and
a second transparent electrode connected to the second metal layer through the second via hole.

16. The display panel according to claim 15, wherein the first metal layer is made of copper, and the second metal layer is made of aluminum.

17. The display panel according to claim 15, wherein the first transparent electrode and the second transparent electrode are disposed at two sides of the second portion.

18. The display panel according to claim 15, wherein the first transparent electrode comprises a first section and a second section, the first section is disposed on a surface of the protective layer, and the second section is extended into the first via hole and in contact with the first metal layer.

19. The display panel according to claim 15, wherein the second transparent electrode comprises a third section and a fourth section, the third section is disposed on a surface of the protective layer, and the fourth section is extended into the second via hole and in contact with the first portion.

20. The display panel according to claim 15, wherein the array substrate further comprises a glass substrate, and the glass substrate is disposed on the second surface of the first metal layer.

* * * * *